United States Patent [19]

Szczesny

[11] Patent Number: 4,589,718
[45] Date of Patent: May 20, 1986

[54] PIN SHROUD WITH LOCKING CLIP

[75] Inventor: David S. Szczesny, Harrisburg, Pa.

[73] Assignee: AMP Incorporated, Harrisburg, Pa.

[21] Appl. No.: 758,012

[22] Filed: Jul. 24, 1985

[51] Int. Cl.⁴ .............................................. H01R 4/02
[52] U.S. Cl. .............................. 339/95 D; 339/176 M
[58] Field of Search ............ 339/95 D, 176 R, 176 M,
339/75 R, 75 M, 17 C, 17 R, 220, 221, 260

[56] References Cited

U.S. PATENT DOCUMENTS

| | | | |
|---|---|---|---|
| 3,705,376 | 12/1972 | Kinkaid et al. | 339/30 |
| 3,796,987 | 3/1974 | Kinkaid et al. | 339/217 S |
| 3,818,569 | 5/1974 | Kinkaid et al. | 29/203 H |
| 3,918,784 | 11/1975 | Lemke et al. | 339/95 D |
| 4,062,610 | 12/1977 | Doty et al. | 339/95 D |
| 4,140,361 | 2/1979 | Sochor | 339/176 M |
| 4,188,715 | 2/1980 | Ammon et al. | 339/176 M |

Primary Examiner—Gil Weidenfeld
Assistant Examiner—David L. Pirlot
Attorney, Agent, or Firm—F. Brice Faller

[57] ABSTRACT

Shroud for pin array comprises a housing having cavities in the base thereof which receive stamped and formed metal locking clips. Each locking clip comprises a planar spring having an aperture therein which receives a pin therethrough. The spring is biased into engagement with the pin to retain the shroud without special features on board.

4 Claims, 5 Drawing Figures

PIN SHROUD WITH LOCKING CLIP

BACKGROUND OF THE INVENTION

The present invention relates to a shroud for a pin array, and more particularly to locking clips which grip the pins to retain the shroud.

Shrouds for pin arrays extending from a printed circuit board, pin header or the like are well known. Such shrouds serve to protect the pin array from damage, and further to guide a mating connector having receptacle contacts into mating engagement with the array. Generally, such shrouds are fixed to the circuit board by means of hardware utilizing through holes in the board, or integral lugs received in such holes in an interference fit. Since the board may have circuit traces on both sides as well as on internal lamina, board space is often at a premium and for some applications it would be desirable to eliminate the holes used to retain the shroud thereto.

SUMMARY OF THE INVENTION

The present invention resides in a shroud having at least one locking clip which acts directly on a respective pin to retain the shroud against the printed circuit board. Each clip is a stamped and formed metal piece received in a cavity opening on the sidewall of the base of the shroud. The clip has a spring with an aperture therein which receives a respective pin therethrough, the spring being biased against the pin so that the edge of the aperture bites into the pin if the shroud is subjected to removal force. Such clips are not necessary for all pins, rather one or two at each end of an elongate shroud for stability. Cavities which receive the clips can be provided by additional coring of conventional molded dielectric shrouds.

The locking clips are readily released by a simple tool inserted in a cavity to deflect the end of the spring and relieve the bias, permitting the shroud to be withdrawn.

Where the pin array extends from a header or other connector on the opposite side of the board, the shroud with locking clips serves to retain the connector on the opposite side as well.

DETAILED DESCRIPTION OF THE PREFERRED EMBODIMENT

Figure 1:
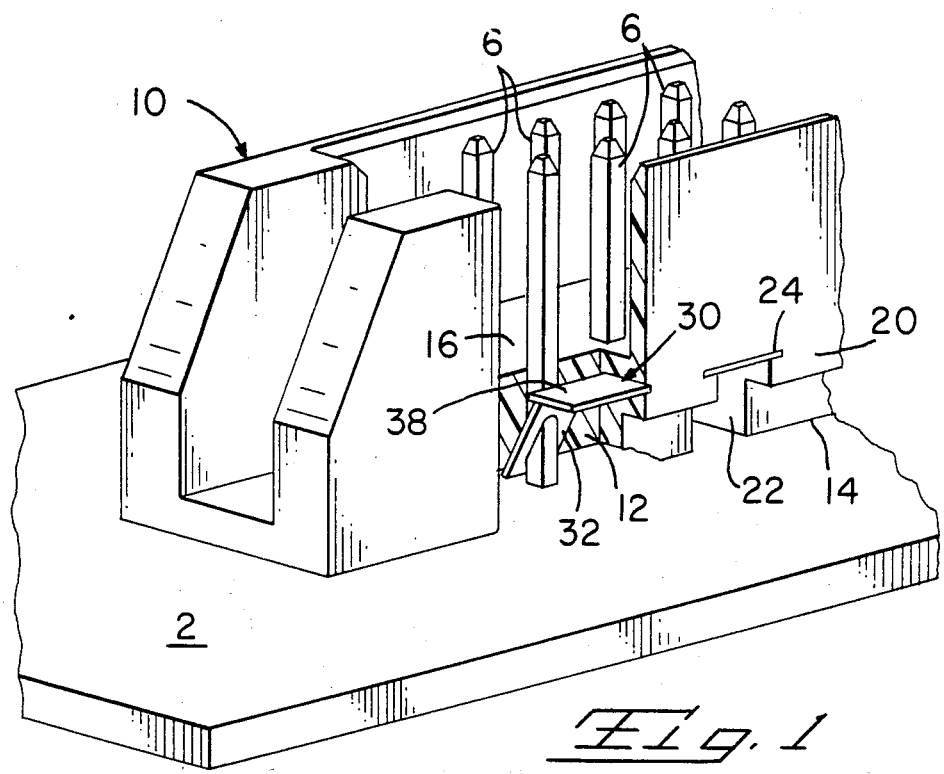
FIG. 1 is a cutaway partial perspective of the shroud on a pin array.
Figure 4:
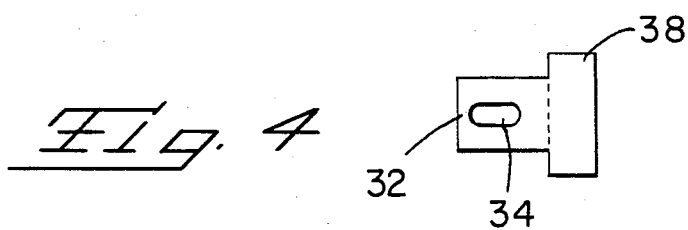
FIG. 4 is a top view of the clip stamping prior to forming.

FIG. 1 depicts a shroud 10 on an array of pins 6 protruding from a printed circuit board 2 in two parallel rows. The shroud 10 comprises a base 12 having a bottom surface 14, an opposed top or inside surface 16, and a plurality of pin receiving passages 18 extending therebetween. The pins 6 extend beyond surface 16 into cavity 15 which receives a mating connector. The base 12 is bounded by opposed external sidewalls 20 which parallel the rows of pins 6, the sidewalls having cavities 22 therein which receive respective locking clips 30. Referring also to FIG. 4, each locking clip 30 is a stamped and formed metal piece comprising a substantially planar spring 30 having an oval aperture 30 and a planar retaining plate 38 formed obliquely thereto.

Figure 2:
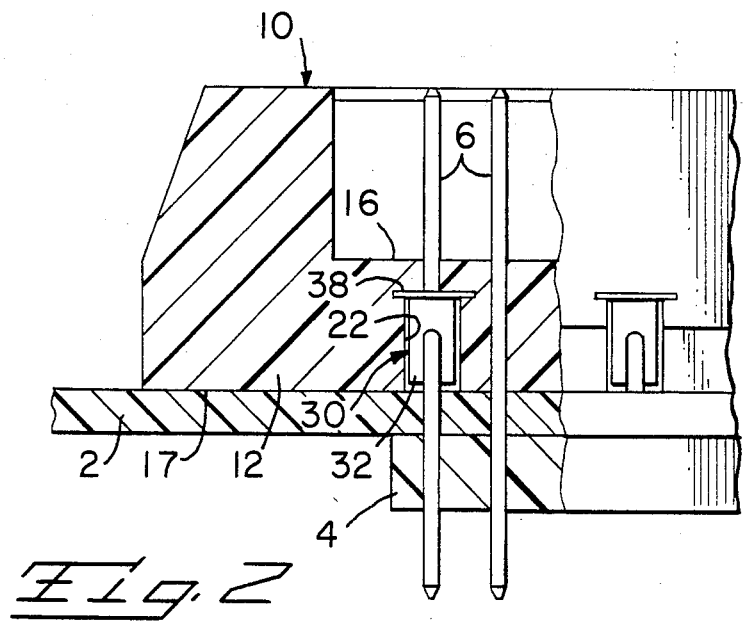
FIG. 2 is a partial side section of the shroud on a pin array.

FIG. 2 shows the pin header 4 on the opposite side of board 2, the pins 6 having long tails which extend into mating cavity 15. A slot 24 extends into the sidewall 20 contiguous with each clip receiving cavity 22, which slot 24 receives the retaining plate 38 as the spring 32 is received in the cavity 22.

Figures 3A, 3B:
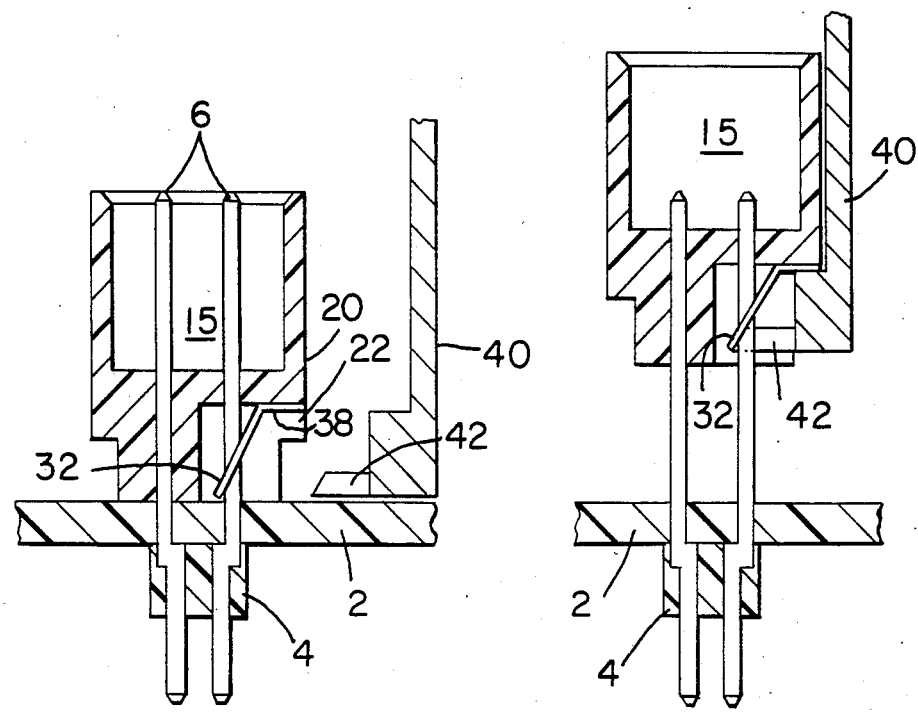
FIG. 3A is an end section of the shroud and removal tool.
FIG. 3B is an end section of the shroud and tool in use.

Referring to FIG. 3A, the plane of spring 32 crosses the axis of pin 6 obliquely thereto, the pin 6 passing through aperture 34. The aperture 34 is slightly out of line with the respective passage 18 before the shroud 10 is received on the pin array, and is biased into alignment to accommodate the pin. This causes opposed edge portions of aperture 34 (FIG. 4) to bite into corners of the pin received through the aperture 30, the pins being of square cross-section. The bias is increased if withdrawal of the shroud 10 from board 2 is attempted without tool 40. Referring to FIG. 3A, the tool 40 has a pair of fingers which fit into cavity 22 and straddle post 6 to bear against the free end of spring 32 to relieve the bias and permit removal of the shroud.

The foregoing is exemplary and not intended to limit the scope of the claims which follow.

I claim:

1. A shroud for reception on a pin array extending from a printed circuit board or the like, said shroud comprising:
    a dielectric base having a bottom surface for disposition against said printed circuit board, an opposed inside surface, and a plurality of pin receiving passages between said surfaces,
    retaining means comprising at least one metal locking clip fixed in said base, said locking clip having a substantially planar spring aligned with a respective passage, said spring having an aperture therethrough which is normally nonaligned with said passage, said spring being disposed substantially obliquely to the axis of a pin and being biased to accommodate said pin through said aperture when said shroud is received on said pin array, said aperture having an edge portion toward said bottom surface which bites into said pin to retain said shroud against said printed circuit board.

2. A shroud as in claim 1 wherein said aperture has an edge portion toward said inside surface which bites into said pin to retain said shroud against said printed circuit board, said edge portion toward said inside surface being opposed to said edge portion toward said bottom surface.

3. A shroud as in claim 1 wherein said passages lie in parallel rows for reception on a like array of pins, said base having opposed parallel external sidewalls paralleling said rows, said spring being disposed in a cavity which opens on an adjacent sidewall.

4. A shroud as in claim 3 wherein said locking clip comprises a substantially planar retaining plate formed obliquely to the plane of said spring, said base having a slot extending normally into said sidewall, contiguous with said cavity, said slot substantially paralleling the inside surface, said slot being profiled to receive said retaining plate with said spring extending freely into said cavity toward said bottom surface.

* * * * *